(12) United States Patent
Compton et al.

(10) Patent No.: US 11,004,638 B2
(45) Date of Patent: May 11, 2021

(54) SYSTEM FOR MONITORING AN ELECTROMECHANICAL RELAY, ASSEMBLY AND METHOD FOR MONITORING RELAY OPERATION CONDITIONS

(71) Applicant: ALSTOM Transport Technologies, Saint-Ouen (FR)

(72) Inventors: John Thomas Compton, LeRoy, NY (US); Jérôme Martin, Vergeroux (FR); Ian Brodie, Naperville, IL (US); Marine Feer, Rochester, NY (US); Yunbo Hou, Hornell, NY (US)

(73) Assignee: ALSTOM Transport Technologies, Saint-Ouen (FR)

( * ) Notice: Subject to any disclaimer, the term of this patent is extended or adjusted under 35 U.S.C. 154(b) by 0 days.

(21) Appl. No.: 16/584,271

(22) Filed: Sep. 26, 2019

(65) Prior Publication Data
US 2021/0098215 A1 Apr. 1, 2021

(51) Int. Cl.
*H01H 47/00* (2006.01)
(52) U.S. Cl.
CPC ................................. *H01H 47/002* (2013.01)
(58) Field of Classification Search
None
See application file for complete search history.

(56) References Cited

U.S. PATENT DOCUMENTS

| | | | | |
|---|---|---|---|---|
| 3,678,344 A | * | 7/1972 | Wedmore | H01H 67/26 361/191 |
| 3,757,223 A | * | 9/1973 | Hazen | H03F 3/72 455/116 |
| 4,710,645 A | * | 12/1987 | Doittau | H01H 9/167 307/115 |
| 4,972,290 A | * | 11/1990 | Sun | H02H 3/04 361/64 |
| 5,455,733 A | * | 10/1995 | Waggamon | H01H 9/167 361/115 |
| 5,595,258 A | * | 1/1997 | Georgas | B60R 25/08 180/287 |
| 5,819,203 A | * | 10/1998 | Moore | G01R 19/2513 702/60 |

(Continued)

FOREIGN PATENT DOCUMENTS

WO WO-2015059410 A1 * 4/2015 ......... H01H 11/0062

*Primary Examiner* — Chico A Foxx
(74) *Attorney, Agent, or Firm* — Troutman Pepper Hamilton Sanders LLP (57) ABSTRACT

The present invention relates to a system for monitoring an electromechanical relay, wherein the electromechanical relay includes a relay coil for actuating at least one switch, the system comprising: at least one sensor adapted to measure an operating condition of the electromechanical relay, wherein the sensor is arranged adjacent or attached to the electromechanical relay; at least one controller communicatively connected to the at least one sensor and at least one memory, wherein the at least one controller is adapted to store the measured operating condition in the at least one memory; at least one transmitter, operatively connected to the controller, wherein the transmitter is adapted to transmit the stored measured operating condition to a remote device.

14 Claims, 5 Drawing Sheets

(56) References Cited

U.S. PATENT DOCUMENTS

| | | | | |
|---|---|---|---|---|
| 6,310,560 B2* | 10/2001 | Weynachter | ......... | H04M 11/002 340/3.32 |
| 6,671,148 B2* | 12/2003 | Evans | ................. | H02J 13/0006 361/64 |
| 7,747,356 B2* | 6/2010 | Andarawis | .......... | H02J 13/0004 700/292 |
| 8,059,005 B2* | 11/2011 | Henricks | ........... | H02J 13/00036 340/635 |
| 8,085,141 B2* | 12/2011 | Hill | ....................... | H03K 17/96 340/446 |
| 8,773,827 B2* | 7/2014 | Kiko | ................... | H02J 13/0017 361/62 |
| 10,340,678 B1* | 7/2019 | Sorenson | ............. | G01R 31/327 |
| 2006/0077607 A1* | 4/2006 | Henricks | ................. | H02H 3/00 361/93.1 |
| 2008/0055024 A1* | 3/2008 | Kersten | ............... | H01H 47/002 335/79 |
| 2009/0206059 A1* | 8/2009 | Kiko | ................ | H02J 13/00036 218/143 |
| 2015/0200068 A1* | 7/2015 | Kinoshita | ............. | H01H 47/22 361/170 |
| 2017/0053764 A1* | 2/2017 | Mori | ................... | H01H 1/0094 |

\* cited by examiner

SYSTEM FOR MONITORING AN ELECTROMECHANICAL RELAY, ASSEMBLY AND METHOD FOR MONITORING RELAY OPERATION CONDITIONS

FIELD OF THE INVENTION

The present invention concerns a system for monitoring an electromechanical relay.

Further, the present invention concerns an assembly comprising an electromechanical relay including an actuation portion including a first coil, and a system for monitoring the electromechanical relay.

Finally, the present disclosure relates to a method for monitoring relay operating conditions.

BACKGROUND

Electromechanical relays fail or go out of adjustment after being operated for some period of time. As a consequence, relay maintenance must be performed in order to ensure continuous correct relay operation. Typically, however, relay maintenance is performed without understanding the operating conditions that the relay has experienced during the operating interval between maintenance procedures. Consequently, the most conservative assumptions must be made in determining maintenance actions. For example, after some fixed period of operation, the relay is replaced even if the number of actuations experienced by the relay during operation is a fraction of the expected lifetime of the relay. For another example, a relay is removed from service after a fixed period of operation, maintenance procedures are performed to ensure that the relay is properly adjusted, then the relay is placed back into service, even if the number of relay actuations experienced by the relay would not normally cause the relay to go out of adjustment. Because of these conservative assumptions, relay maintenance cost is significantly higher than it could be if relay operating conditions were factored into the maintenance decisions.

In the above scenarios the worst case for relay operating conditions (for example, the maximum number of relay actuations and de-actuations) is assumed leading to higher maintenance cost. Another approach is for the entity that initiates the relay actuation and de-actuation, typically a computer, to maintain a record of relay actuations. This approach has several shortcomings with respect to the solution described above, notably the additional software that must be included to count relay actuations and some mechanism for ensuring that the operating conditions actually relate to the installed relay: if the relay has been replaced without resetting the counter maintained by the software, the counter may indicate that the relay has significantly higher life than it actually has.

SUMMARY

According to one aspect, the invention relates to a system for monitoring an electromechanical relay, wherein the electromechanical relay includes a relay coil for actuating at least one switch, the system comprising: at least one sensor adapted to measure an operating condition of the electromechanical relay, wherein the sensor is arranged adjacent or attached to the electromechanical relay; at least one controller communicatively connected to the at least one sensor and at least one memory, wherein the at least one controller is adapted to store the measured operating condition in the at least one memory; at least one transmitter, operatively connected to the controller, wherein the transmitter is adapted to transmit the stored measured operating condition to a remote device.

According to another aspect, an assembly is provided comprising:
an electromechanical relay including an actuation portion including a first coil; and
a system for monitoring the electromechanical relay, including:
  at least one sensor adapted to measure an operating condition of the electromechanical relay, wherein the at least one sensor is arranged adjacent or attached to the electromechanical relay;
  at least one controller communicatively connected to the at least one sensor and at least one memory, wherein the at least one controller is adapted to store the measured operating condition in the at least one memory; and
  at least one transmitter, operatively connected to the controller, wherein the transmitter is adapted to transmit the stored measured operating condition to a remote device.

According to further aspect, a method is provided for monitoring relay operation conditions comprising the steps of:
Providing a system for monitoring an electromechanical relay to an electromechanical relay, wherein the electromechanical relay includes a coil for actuating at least one switch;
measuring at least one operating condition of the electromechanical relay, wherein the sensor is adjacent or attached to the electromechanical relay;
storing the at last one measured operating condition in at least one memory;
transmitting at least one stored measured operating condition to a remote device.

Further advantages, features, aspects and details are evident from the dependent claims, the description and the drawings.

So that the manner in which the above recited features of the present invention can be understood in detail, a more particular description of the invention, briefly summarized above, may be read by reference to embodiments. The accompanying drawings relate to embodiments of the invention and are described in the following:

DETAILED DESCRIPTION

Figure 1:
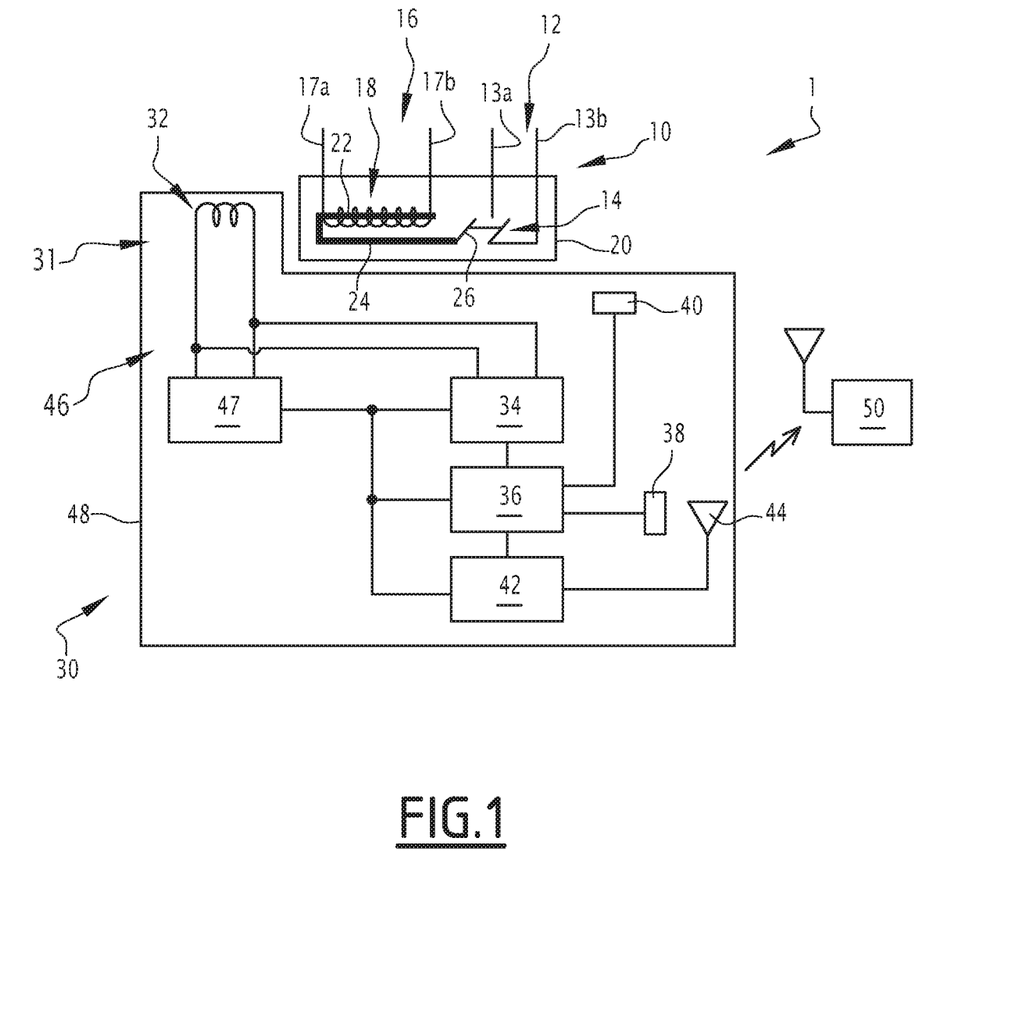
FIG. 1 shows schematically an electromechanical relay and a system for monitoring an electromechanical relay according to an embodiment.

FIG. 1 shows schematically a system 1 comprising an electromechanical relay 10 and a system 30 for monitoring the electromechanical relay 10 according to an embodiment.

The electromechanical relay 10 is an electrically operated switch. According to an embodiment, the electromechanical relay 10 is adapted to switch voltages of between 25V and 400V, in particular voltages up to 250V.

According to embodiments, the electromechanical relay 10 includes one or more switches 12 and an actuation portion 16 adapted to actuate the at least one switch 12. In the following, only an electromechanical relay with one switch is described. However, the disclosure also relates to relays with more than one switch.

The switch includes a movable contact 14, which is movable between a closed position, in which an electric current is enabled to flow between a first switch terminal 13a and a second switch terminal 13b, and an open position, in which a current flow between the first switch terminal 13a and the second switch terminal 13b is inhibited. The switch 12 is adapted to switch voltages of between 25V and 400V, in particular voltages up to 250V, in particular with a current up to 10 A. These voltage and current ranges for the switch are exemplary and switches having other voltage and current ranges may be used in embodiments of the invention.

Depending on the switch, the switch 12 may be a normally open switch with the switch in its open, current flow inhibiting position when the electromechanical relay 10 is in its non-actuated state, a normally closed switch with the switch in its closed, current flow enabling position when the relay is in its non-actuated state, or a double throw switch with the movable contact 14 adapted to enable current flow between the switch terminal connected to the movable contact and a normally closed switch terminal when the relay is in its non-actuated state or a normally open switch terminal when the relay is in its actuated state. In the double throw case, the switch has three terminals: a common terminal for the movable contact, a terminal connected to the normally closed contact, and a terminal connected to the normally open contact.

The first switch terminal 13a and the second switch terminal 13b are adapted to be connected to a load.

The actuation portion 16 includes a first terminal 17a and a second terminal 17b which are connected to a relay coil 18 that can be energized by a current flowing through the relay coil 18. In other words, the actuation portion 16 also includes the relay coil 18. Further, the first and second terminals 17a, 17b are adapted to be connected to command device (not shown). The command device is adapted to decide whether the relay should be switched, for example by human interaction actuating a button or automatically.

The voltage and current needed for energizing the relay coil 18 is typically lower than the voltage and current which is supported by the switch 12. For example, the relay coil 18 is energized by applying to terminals 17a and 17b a voltage between 9V and 15V with corresponding current between 130 mA and 215 mA; a coil with these operating characteristics operates a switch 12 that switches, for example, 72V to a load that draws 3A through terminals 13a and 13b. The current for energizing the coil is a direct current (DC) or an alternating current (AC).

According to embodiments, the actuation portion 16 and the switch 12 are provided in a common housing 20. Terminals 13a, 13b, 17a, 17b extend through the housing. In particular, the relay coil 18 and the movable contact 14 are provided within the housing 20.

In an embodiment, the relay coil 18 of the electromechanical relay 10 is wrapped around a magnetic core 22. The magnetic core 22 is for example a magnetic material with a high magnetic permeability and in particular made of ferromagnetic metal. In other embodiments, also other suitable materials may be used.

In the embodiment shown in FIG. 1, the magnetic core 22 is connected to a yoke 24 for guiding the magnetic field. An armature 26 is movably connected to the yoke 24. In an example, the armature 26 is hinged to the yoke 24. The armature 26 is connected via a rigid link to the movable contact 14. Thus, in some embodiments the armature 26 and the movable contact 14 move together. In relays with multiple switches, the armature is connected via one or more rigid links to a plurality of movable contacts 14.

Upon activation of the energizing current applied to the first and second terminals 17a, 17b, the armature 26 is moving towards magnetic core and moves therefore the movable contact 14 from a first position, in FIG. 1 the open position, to a second position, in FIG. 1 the closed position. In some embodiments, when the current is deactivated, the armature 26 moves back to the first position due to a spring force.

In other embodiments, also other forms of electromechanical relays may be used which are using a coil for activating the contacts, for example a reed relay in which the movable contact 14 is made of a ferromagnetic material such that it responds directly to the magnetic field produced by the relay coil 18, thereby eliminating the armature 26 and the associated rigid link between armature 16 and movable contact 14.

According to embodiments, the system 30 for monitoring the electromechanical relay is provided with a first sensor 31 for sensing an operating condition of the electromechanical relay 10. The sensor comprises a detection portion 32 and a transducing portion 34 electrically connected to the detection portion 32. The transducing portion is connected to at least one controller 36.

In some embodiments, which may be combined with other embodiments, the detection portion 32 is adapted to sense the magnetic field of the relay coil 18. For example, the detection portion 32 may include a sensor coil, which is adapted to be placed adjacent to the relay coil 18 of the electromechanical relay 10. The distance of the detection portion 32 to the relay coil 18, is selected such that the detection portion 32 is able to sense a change of the magnetic field generated by the relay coil 18 of the electromechanical relay 10, in particular when the relay coil 18 is activated with the nominal current. In other words, the detection portion 32 is arranged to detect the stray magnetic field of the relay coil 18 of the actuation portion 16 and thereby adapted to sense relay transitions. A relay transition is an actuation, a de-actuation or both.

In other embodiments, also other types of sensors may be used for detecting the relay transitions, as it will be explained below.

According to embodiments, which may be combined with other embodiments herein, the detection portion 32, in particular the sensor coil of the detection portion 32, is placed coaxially to the relay coil 18 of the actuation portion 16 of the electromagnetic relay 10. In the embodiment shown in FIG. 1, the detection portion 32 is spaced apart in axial direction from the relay coil 18. In another embodiment, the detection portion 32 is placed near the gap between magnetic core 22 and armature 26 and oriented such that it intercepts the stray magnetic field emanating from the gap during actuation and de-actuation of the relay.

According to embodiments, the transducing portion 34 is adapted to amplify the detection signal provided by the detection portion 32. In addition or alternatively, the transducing portion 34 may transform the detected signals to digital signals and transmit these signals to the at least one controller 36.

In other embodiments, the transducing portion 34 is omitted and the detection portion 32 is directly connected to the at least one controller 36 and/or via a converting portion 47 as it will be explained below. In such a case the first sensor only includes the detection portion 32.

In some embodiments, the system 30 includes a second sensor 40 to sense a second operating condition of the electromechanical relay. For example, the second sensor 40 is a temperature sensor adapted to sense the operational temperature of the electromechanical relay; the operational temperature thereby sensed is the ambient temperature in which the system 30 operates or the temperature of the common housing 20 of electromechanical relay 10. The sensed temperature is used, for example, to predict better the expected life of the electromechanical relay 10, as operation at temperature extremes reduces the life of the relay.

In some embodiments, the second sensor 40 is a vibrational sensor adapted to measure the mechanical vibrations produced by the actuation and de-actuation of the electromechanical relay 10. The sensed vibration is used, for example, to detect a change in the mechanical vibrations over time, the change being predictive of an incipient failure in the mechanism of the relay. In a related embodiment, the first sensor 31 qualifies the vibration measurements provided by second sensor 40 to ensure that the vibration measurements are related to relay actuations/de-actuations and are not measurements of ambient vibrations from the operating environment. The vibration sensor in these embodiments may be, but is not limited to, an accelerometer.

In some embodiments, a plurality of second sensors 40 is included to monitor a corresponding plurality of operating conditions. For example, a pair of temperature sensors, with one adapted to measure the ambient temperature and one adapted to measure the common housing 20 temperature, is used to enable the determination of a rise in temperature of the electromechanical relay 10 over an ambient temperature. In another example, a temperature sensor and an accelerometer provide both an operating temperature measurement and a mechanical vibration measurement.

The at least one controller 36 is adapted to store the number of sensed operating conditions of the first sensor 34 and/or second sensor 40, for example the relay transitions of the electromechanical relay and/or the operating temperature into a memory 38. In other embodiments, the at least one controller 36 is also adapted to store the time of the detected or sensed operating condition in the memory, in particular the time of the relay transition, in particular of the actuation and/or de-actuation, and/or the time of the measured temperature. In some embodiments, the at least one controller is adapted to store the number of relay transitions in the memory 38.

In some embodiments, the memory 38 is adapted to include a relay identifier, for example a unique identifier, the relay type, the relay installer, the relay installation date, relay test results, nominal relay operating conditions, and/or relay operating condition limits.

According to example, the memory 38 is adapted to maintain a history of relay operating conditions. In other examples, the memory is adapted to store the operating conditions for a predefined time interval, for example the number of relay transitions within that predefined time interval. For example, the predefined interval may start at a last transmission of operating conditions.

According to some embodiments, the memory 38 is an EEPROM (Electrically Erasable Programmable Read Only Memory).

According to some embodiments, the system 30 includes at least one transceiver 42 connected to an antenna 44. The transceiver 42 is adapted to transmit data, in particular one or more operating conditions and/or the relay identifier, and to receive data, for example requesting the transmission of one or more operating conditions and/or the relay identifier. In other words, the transceiver 42 includes a transmitter and a receiver.

In an embodiment, the transceiver 42 is adapted to receive a signal that the number of relay operating conditions, for example the number of relay transitions, in particular the number of the actuations and/or de-actuations, of the electromechanical relay should be transmitted. Then, the transceiver is adapted to transmit the respective operating conditions. Further, the transceiver is adapted to transmit the relay identifier, in particular in addition to the relay operating conditions.

Instead of a transceiver 42 only a transmitter may be used throughout the embodiments disclosed herein. In such a case, the transmission of the at least one operating conditions may be manually activated, for example by actuating a button, an electronic contact or the like.

The system 30 further comprises a power source 46. The power source 46 includes the detection portion 32 and a converting portion 47. The power source 46 is adapted to provide power at least to the transducing portion 34, the at least one controller 36 and the at least one transceiver 42. According to the embodiment of FIG. 1, the converting portion 47 is electrically connected to the detection portion 32, which provides the power to the power source 47 during sensing of the actuation of the electromechanical relay 10.

For example, in case the detection portion 32 includes a sensor coil, a current is generated or induced in the detection portion 32 due to the activation of the relay coil 18 of the actuation portion 16. In other words, the change of the magnetic field generated by the coil 18 induces a current into the detection portion 32 of the first sensor 31 and the power source 46. Then, the converting portion 47 is adapted to transform the generated current to a current able to power at least the transducing portion 34, the at least one controller 36 and the at least one transceiver 42. For example, the converting portion 47 may include an AC/DC converter. The power source 46 enables a reliable power support, as it does not depend on external power sources or need to be recharged.

Thus, according to embodiments, the power source 46 and the at least one first sensor 31 share a common element, here the detection portion 32.

In such an embodiment, the detection portion 32 is not only arranged to detect relay conditions like the relay transitions, in particular actuations and/or de-actuations, but also to provide power for the system 30 for monitoring the electromechanical relay at least during the relay transitions.

In some embodiments, the detection portion may produce an electrical impulse on relay actuation and a complementary electrical impulse on relay de-actuation, with the converting portion 47 producing a corresponding momentary power on each of relay actuation and relay de-actuation. In a variant of such an embodiment, the momentary power provided to controller 36 is interpreted by the controller as an actuation or de-actuation of electromechanical relay 10, with the controller storing the relay transition event in memory 38. In other words, the controller 36 interprets each power on event as a relay transition and uses the momentary power provided by detection portion 32 and converting portion 47 to process the event and store it in memory 38. In such an embodiment, the function of the transducing portion 34 is not provided by a separate element but is incorporated into the converting portion 47.

The system 30 for monitoring the electromechanical relay further comprises a housing 48. The housing surrounds the detection portion 32, the optional transducing portion 34, the at least one controller 36, the transceiver 42, the temperature sensor 40 and the antenna 44.

The temperature sensor 40, the detection portion 32, and/or the antenna 44 may be, in an alternative embodiment, arranged outside the housing 48 of the system 30.

The housing comprises fixing devices, for example clamps or a glue, adapted to fix the housing 48 to the housing 20 of the electromechanical relay 10, such that the detection portion 32 is adapted to sense or detect a relay transition. For example, the detection portion 32 is aligned, as described above, with respect to the relay coil 18 of the actuation portion 16. In other embodiments, for example in case the detection portion 32 is arranged outside the housing 48, the detection portion 32 is applied to the outside of the relay housing 20, such that the detection portion 32 is adapted to sense a transition of the relay, for example to sense the change of the magnetic field of the relay coil 18 of the actuation portion 16.

In some embodiments, which may be combined with other embodiments disclosed herein, the housing 48 of the system 30 is conformed to the housing 20 of the electromechanical relay in order to allow the detection portion 32 to sense a transition of the relay. For example, the detection portion 32 is aligned to the relay coil 18 of the actuation portion 16, such that the detection portion is able to sense the magnetic field of the coil 18 if the coil 18 is activated with a nominal current flowing therethrough.

In other embodiments, which may be combined with other embodiments disclosed herein, the system 30 for monitoring an electromechanical relay and the relay 10 are arranged in a common housing.

FIG. 1 further shows a remote device 50, which is adapted to receive the signal transmitted by the transceiver 42, wherein the signal includes at least one relay condition, for example, at least one relay transition, the number of relay transitions and/or at least one operating temperature.

In some embodiments, which may be combined with other embodiments disclosed herein, the communication connection between the transceiver 42 and the remote device 50 may be realized with a wireless connection, for example via NFC (Near Field Communication), RFID (Radio Frequency IDentification), Bluetooth, WiFi and/or a mesh network. In other embodiments, or additionally, the communication connection between the transceiver 42 and the remote device 50 is realized with a wired connection, for example via a USB (Universal Serial Bus), field bus, Ethernet, or the like.

In some embodiments, the transceiver 42 may be omitted, if the at least one controller 36 has itself the communication capabilities for emitting and receiving signals, for example in the case that the transceiver capabilities are integrated into the at least one controller 36.

Figure 2:
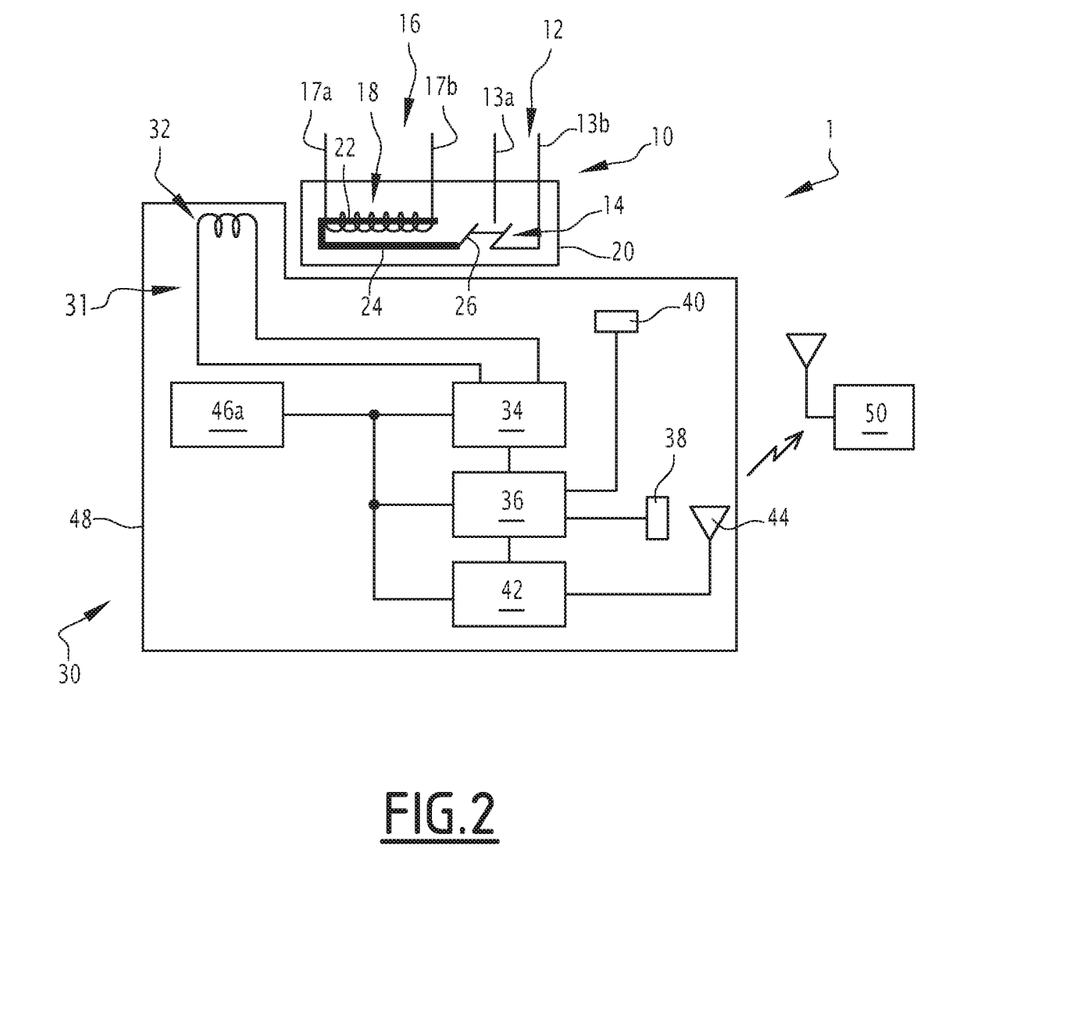
FIG. 2 shows schematically an electromechanical relay and a system for monitoring an electromechanical relay according to an embodiment.

FIG. 2 shows another embodiment of the invention. The same reference signs refer to the same features as in the embodiment of FIG. 1.

In the embodiment of FIG. 2, an internal power source 46a is provided.

According to embodiments, the internal power source 46a may include a continuous power source like a battery or a capacitor. The internal power source 46a may further include some electric circuitry for regulating the power source. In other words, the power supply is independent from the relay coil 18 or a current driving the relay coil 18. The internal power source 46a is therefore a continuous power supply. The power source 46a is adapted to provide power at least to the transducing portion 34, the at least one controller 36 and/or the at least one transceiver 42.

In other embodiments, the internal power source 46a includes an electromechanical generator adapted to produce electricity from mechanical vibrations of the relay 10. For example, the mechanical vibrations are caused by an actuation or de-actuation of the relay or the relay coil 18. In another example, the mechanical vibrations are a natural part of the operating environment as may be the case if relay 10 and associated monitoring system 30 are installed on a vehicle such as an automobile, a train or an elevator.

According to a further example, which may be combined with other embodiments disclosed herein, the internal power source 46a is connected to the antenna 44 and receives energy from the remote device 50, for example in case an NFC or RFID connection is provided between the remote device and the transceiver 42.

In some embodiments, different power sources are combined, in particular different types of power sources are combined. For example, a type of a power source depends on the source of the power. A first type of power source is dependent on the activation of the relay coil, like the power source 47 of FIG. 1 or the electromechanical generator described above. A second type of power source is a continuous power source like a battery or a capacitor. A third type of power source receives electrical energy from the remote device, for example in case of an NFC or RFID connection or a physical connection through a communication connector like USB.

In an example of combination of different power sources, the internal power source 46a, in particular the continuous power source of FIG. 2, and a power source being dependent on the activation of the relay coil 18, in particular the power source 46 of FIG. 1 are combined. For example, the internal continuous power source may be charged by a power source being dependent on the activation of the relay coil 18, for example by the provided power of the detection portion 32. In such a case, the first type of power source is combined with the second type of power source. In another example, the second and the third type of power source may be combined, so that, for example, the second type of power source is charged by the third type of power source.

Also the first and third type of power source may be combined. In such a case, during the activation of the relay 10, the power is provided through the first type of power source and during the transmission of the relay operating condition by the transceiver 42 (or the at least one controller 36) the power is provided by the third type of power source.

According to other embodiments, the different power sources or different types of power sources are provided to power different portions of the system 30. For example, a first power source or the first type of power source is provided to power the at least one first sensor 31 and the controller 36 and a second power source, for example the second and/or third type of power source is provided for the transceiver 42. In an example, the first power source may be the power source 46 or the internal power source 46a, whereas the second power source is provided by an RFID reader or a bus connection, when the external device reads or requests the stored operating conditions. In another example, the first power source may be the power source 46 and the second power source may be the internal power source 46*a*.

Figure 3:
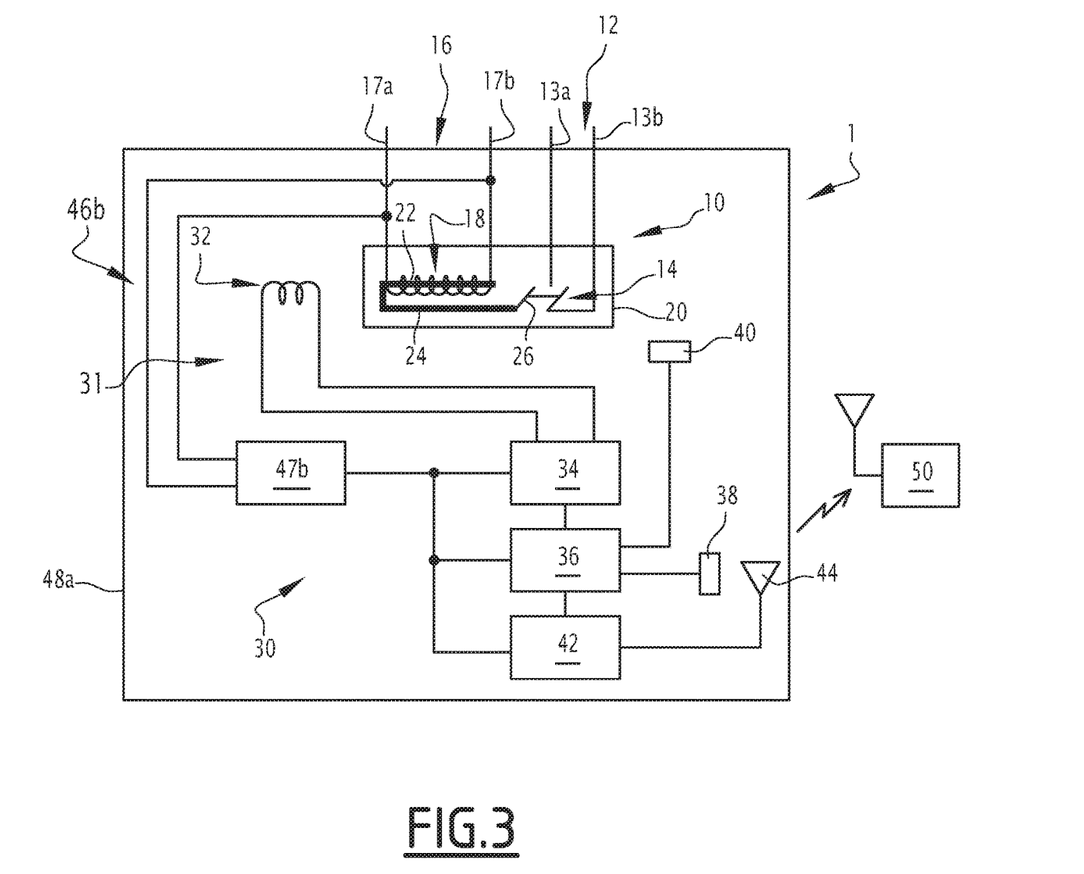
FIG. 3 shows schematically an electromechanical relay and a system for monitoring an electromechanical relay according to an embodiment.

FIG. 3 shows another embodiment of the invention. The same reference signs refer to the same features as in the embodiment of FIG. 1.

In the embodiment of FIG. 3, a power source 46*b* is provided. The power source 46*b* is adapted to provide power at least to the transducing portion 34, the at least one controller 36 and/or the at least one transceiver 42.

The power source 46*b* includes connections to the first and second terminals 17*a*, 17*b* and a converting portion 47*b*. In other words, the converting portion is connected to the first and second terminals 17*a*, 17*b* in order to obtain power during the activation of the electromechanical relay. In other words, the power source 46*b* is connected in parallel to the relay coil 18 of the activation portion 16 of the electromechanical relay 10. The power source 46*b* being dependent on the activation of the relay coil and corresponds therefore to the first type of power sources. In this embodiment, the relay 10 and the system for monitoring the electromechanical relay 30 are provided in a common housing 48*a*. The converting portion 47*b* is adapted to transform the generated current to a current able to power at least the transducing portion 34, the at least one controller 36 and/or the at least one transceiver 42. For example, the converting portion 47*b* may include an AC/DC converter or a DC/DC converter.

In other embodiments, the internal power source 46*a* of FIG. 2 and the power source 46*b* of FIG. 3 may be combined. For example, the internal power source may be charged by the provided power of the terminals 17*a*, 17*b*, as already explained with respect to FIG. 2.

In some embodiments, which may be combined with other embodiments disclosed herein, in case the current may be directly usable by the transducing portion, the at least one controller 36 and/or the at least one transceiver 42, the converting portion 47*b* may be omitted.

In some embodiments, the at least one first sensor 31 may use the connection of the power source 46*b* to the first and second terminals 17*a*, 17*b* in order to sense the transitions of the electromechanical relay. In such a case, the first sensor and the power source 46*b* share a common element, namely the connection to the first and second terminals 17*a*, 17*b*.

In some embodiments, the connection of the power source 46*b* to the first and second terminals 17*a*, 17*b* is achieved by external wiring. For example, a relay is configured to be plugged into a socket that provides mechanical support for the relay and electrical connection between terminals 13*a*, 13*b*, 17*a* and 17*b* and corresponding load and control wiring; in an embodiment having such a socketed relay, power source 46*b* is provided with its own pair of terminals that plug into dedicated mating terminals in the relay socket, with the connection between the power source 46*b* terminals and first and second terminals 17*a*, 17*b* provided by wiring contained within the socket itself or by wiring external to the socket. In another example, a mechanically compliant, electrically non-conductive pad is interposed between the relay and the relay socket to ensure that the relay is held firmly in place when installed in the socket; in an embodiment that includes such a pad, electrical conductors are disposed on the surface of the pad or embedded within the pad to provide the connection between power source 46*b* and first and second terminals 17*a*, 17*b*.

Figure 4:
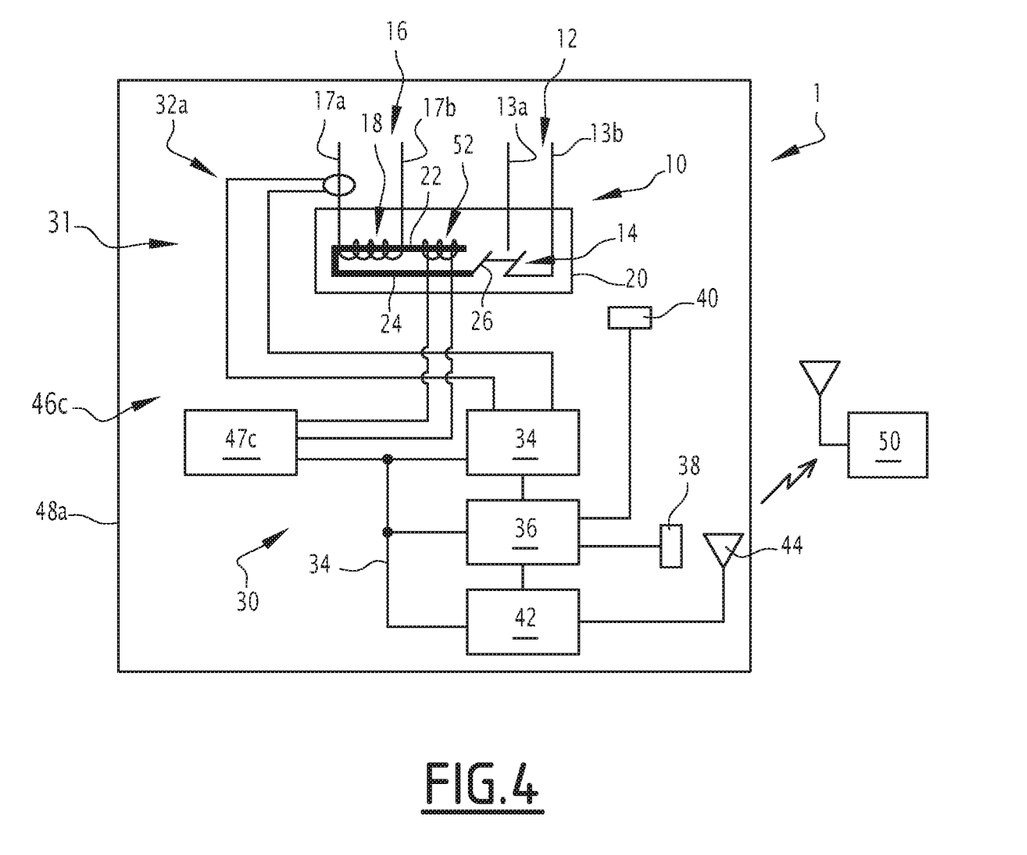
FIG. 4 shows schematically an electromechanical relay and a system for monitoring an electromechanical relay according to an embodiment.

FIG. 4 shows another embodiment of the invention. The same reference signs refer to the same features as in the other embodiments.

In the embodiment of FIG. 4, the detection portion 32*a* of the first sensor 31 is realized as a current sensor, adapted to sense the current used for actuation of the coil 18. For example, the detection portion 32*a* may be a Hall-effect sensor or a current clamp. The type of sensor depends on the current used for activating the relay coil 18 of the actuation portion 16, that means whether the current is alternating current (AC) or direct current (DC).

In other embodiments, the sensor 31 is adapted to be electrically connected to the first and second terminal 17*a*, 17*b* and adapted to measure the voltage between the first and second terminals 17*a*, 17*b*. In other words, the sensor 31 is adapted to measure the voltage of the coil 18 of the actuation portion 16.

Further, in the embodiment of FIG. 4, the core 22 of the relay coil 18 is provided with a second coil 52, which is electrically connected to the converting portion 47*b*. In other words, the coil 18 and the second coil 52 share a common core 22. This enables an effective transmission of electrical energy from the coil 18 to the second coil 52. In other words, the coil 18 and the second coil 52 are separated and independent from each other. In this embodiment, the power source 46*c* includes the second coil 52 and the converting portion 47*c*.

In some embodiments of FIG. 4, the first sensor 31 and the power source 46*c* share elements in common. For example, the detection portion 32*a* is connected to second coil 52, thereby using second coil 52 to provide power to the monitoring system 30 and to sense actuations and de-actuations of the electromechanical relay 10. In another example, converting portion 47*c* is connected to detection portion 32*a*, wherein detection portion 32*a* is adapted to sense the current used for actuation of coil 18; in an embodiment having this arrangement, detection portion 32*a* has the form of a coil wrapped around the conductor from first terminal 17*a*, wherein the electrical energy provided to converting portion 47*c* is AC if the control signal provided to first and second terminals 17*a*, 17*b* is AC or is an impulse on actuation or de-actuation of the relay if the control signal is DC.

The power source 46*c* is adapted to provide power at least to the transducing portion 34, the at least one controller 36 and/or the at least one transceiver 42.

In some embodiments, which may be combined with other embodiments disclosed herein, the first sensor 31 includes a vibrational sensor adapted to detect the mechanical vibrations of the relay, in particular generated by a transition of the electromechanical relay. In such a case, the first sensor may share an element with the power source 46*a*, namely the electromechanical generator. As discussed above with respect to the second sensor 40 the first sensor 31 is a vibrational sensor adapted to measure the mechanical vibrations produced by the actuation and de-actuation of the electromechanical relay 10. The sensed vibration is used, for example, to detect a change in the mechanical vibrations over time, the change being predictive of an incipient failure in the mechanism of the relay. The vibration sensor in these embodiments may be, but is not limited to, an accelerometer.

Figure 5:
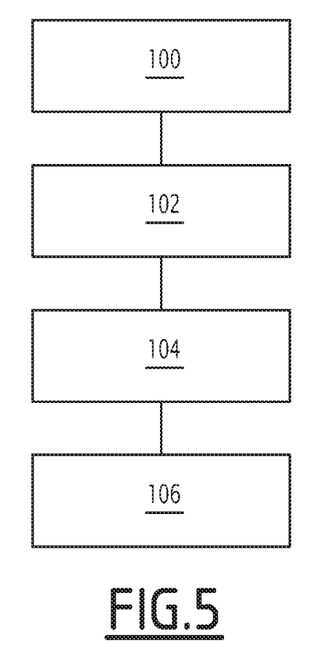
FIG. 5 shows a flow chart of a method according to an embodiment.

FIG. 5 shows schematically a flow chart of a method.

In box 100 a system 30 for monitoring an electromechanical relay, wherein the electromechanical relay includes a relay coil 18 for actuating at least one switch 12, is provided. For example, the system 30 is attached to an existing electromechanical relay. In other embodiments, the system 30 and the electromechanical relay are arranged in a common housing 48*a*.

In box 102 an operating condition of the electromechanical relay 10, wherein a sensor 31, 40 is adjacent or attached to the electromechanical relay, is measured. The operating condition may be for example the transition of the electromechanical relay or the operating temperature of the relay.

In box 104 storing the measured operating condition in the at least one memory, for example the memory 38. In an embodiment, the operating condition is stored with a time stamp.

In box 106, the stored measured operating condition is transmitted to a remote device 50. For example, the controller 36 may read for that purpose one or more operating conditions from the memory 38, provide the read operating conditions to the transceiver 42, which in turn transmits the operating conditions to the remote device 50. In some embodiments, the remote device 50 has sent beforehand a query to the system 30 in order to obtain the operating conditions. In other embodiments the transmission is triggered by an actuated button.

By counting relay transitions, in particular actuations and/or de-actuations, or other relay operating conditions such as relay operating temperature, storing the operating conditions for an interval of relay operation, and permitting the retrieval of the stored operating condition after the interval of relay operation, the operating conditions experienced by the relay are available for use in making maintenance decisions regarding the relay In the present disclosure, real relay operating condition history is used to make maintenance decisions The relay condition monitoring function is physically co-located with a given relay, thereby avoiding the additional software in the entity that controls the relay; and the storage of the relay operating conditions is also directly associated with and co-located with the monitoring function, thereby ensuring that the recorded operating conditions apply directly to the subject relay.

Further embodiments of the system, the assembly and/or the method may relate to one or more of the following features, which may be combined in any technical feasible combination:

the at least one sensor is adapted to detect a transition of the at least one relay, wherein the controller is adapted to store at least one chosen from: the number of transitions in the at least one memory, the transition and the time of a transition, the at least one sensor is adapted to detect at least one of an activation and a deactivation of the at least one coil of the electromechanical relay, the at least one sensor includes a detection portion, which is located adjacent to the coil, in particular at a distance of less than 5 cm, in particular less than 2 cm, the at least one sensor includes a detection portion, which is attached to or arranged within the housing of the electromechanical relay, the at least one sensor is adapted to measure at least one chosen from: the changes in the magnetic field of the coil of the electromechanical relay, the current supplied to the coil of the electromechanical relay, the supply voltage of the coil of the electromechanical relay, and mechanical vibrations of the electromechanical relay caused by a transition of the electromechanical relay, the at least one sensor is adapted to measure the operating temperature of the electromechanical relay, the at least one transmitter is adapted to transmit the stored measure operating condition via a wired connection or a wireless connection, the system further comprises at least one power source adapted to power at least one element chosen from the at least one sensor, the at least one controller and the at least one transmitter, the at least one power source is chosen from a first type of power source being dependent on the activation of the relay coil, a second type of power source being a continuous power source, and a third type of power source receiving electrical energy from the remote device adapted to receive the at least one transmitted operating condition from the at least one transmitter, the power source is independent from the activation of the electromechanical relay, the power source is dependent on the activation of the electromechanical relay, the second type of power source includes an element chosen from a battery and a capacitor, the first type of power source is chosen from: a parallel connection to the terminals of the coil of the relay, a coil arranged in order to generate a current when the coil of the relay is activated to generate a transition of the relay, and an electromechanical generator to produce electricity from mechanical vibrations of the relay caused by a transition of the relay or from mechanical vibrations inherent in the operating environment of the relay, the third type of power source is chosen from: an NFC connection, an RFID connection, a wired connection through a communication connector, and a USB connection, the system comprises at least two different types of power source, the power source and the at least one sensor share at least one detection portion, the detection portion is selected from: a parallel connection to the terminals of the relay coil, a sensor coil arranged in order to generate a current when the coil of the relay is activated, an electromechanical generator to produce electricity form mechanical vibrations of the relay caused by a transition of the switch, a voltage sensor detecting the voltage applied to the relay coil, and a current sensor detecting the current applied to the relay coil, the electromechanical relay and the system for monitoring the electromechanical relay are arranged in a common housing, and/or the system for monitoring the electromechanical relay is adapted to be fixed to the electromechanical relay.

In some examples of implementation, any feature of any embodiment described herein may be used in combination with any feature of any other embodiment described herein.

The invention claimed is:

1. A system monitoring an electromechanical relay, wherein the electromechanical relay comprises a relay coil for actuating at least one switch, the system comprising:

at least one sensor adapted to measure an operating condition of the electromechanical relay, wherein the sensor is arranged adjacent or attached to the electromechanical relay;

at least one sensor adapted to measure an operating condition of the electromechanical relay, wherein the sensor is arranged adjacent or attached to the electromechanical relay;

at least one transmitter, operatively connected to the controller, wherein the transmitter is adapted to transmit the stored measured operating condition to a remote device, at least one power source adapted to power at least one element chosen from the at least one sensor, the at least one controller and the at least one transmitter, wherein at least one of the power source and the at least one sensor share at least one detection portion.

2. The system according to claim 1, wherein the at least one sensor is adapted to detect a transition of the at least one relay, wherein the controller is adapted to store at least one chosen from: the number of transitions in the at least one memory, the transition and the time of a transition.

3. The system according to claim 1, wherein the at least one sensor is adapted to detect at least one of an activation and a deactivation of the at least one coil of the electromechanical relay.

4. The system according to claim 3, wherein the at least one sensor is adapted to measure at least one chosen from: the changes in the magnetic field of the coil of the electromechanical relay, the current supplied to the coil of the electromechanical relay, the supply voltage of the coil of the electromechanical relay, and mechanical vibrations of the electromechanical relay caused by a transition of the electromechanical relay.

5. The system according to claim 1, wherein the at least one sensor is adapted to measure the operating temperature of the electromechanical relay.

6. The system according to claim 1, wherein the at least one transmitter is adapted to transmit the stored measure operating condition via a wired connection or a wireless connection.

7. The system according to claim 1, further comprising a different type of power source, wherein the different type of power source is chosen from a second type of power source being a continuous power source, and a third type of power source receiving electrical energy from the remote device adapted to receive the at least one transmitted operating condition from the at least one transmitter.

8. The system according to claim 7, wherein the second type of power source includes an element chosen from a battery and a capacitor.

9. The system according to claim 7, wherein the third type of power source is chosen from: an NFC connection, an RFID connection, a wired connection through a communication connector, and a USB connection.

10. The system according to claim 1, wherein the detection portion is selected from: a parallel connection to the terminals of the relay coil, a sensor coil arranged in order to generate a current when the coil of the relay is activated, an electromechanical generator to produce electricity from mechanical vibrations of the relay caused by a transition of the switch, a voltage sensor detecting the voltage applied to the relay coil, and a current sensor detecting the current applied to the relay coil.

11. An assembly comprising:
an electromechanical relay including an actuation portion including a first coil; and a system for monitoring the electromechanical relay, including:
at least one sensor adapted to measure an operating condition of the electromechanical relay, wherein the at least one sensor is arranged adjacent or attached to the electromechanical relay;
at least one controller communicatively connected to the at least one sensor and at least one memory, wherein the at least one controller is adapted to store the measured operating condition in the at least one memory;
at least one transmitter, operatively connected to the controller, wherein the transmitter is adapted to transmit the stored measured operating condition to a remote device; and
at least one power source adapted to power at least one element chosen from the at least one sensor, the at least one controller and the at least one transmitter, wherein at least one of the power source and the at least one sensor share at least one detection portion.

12. The assembly according to claim 11, wherein the electromechanical relay and the system for monitoring the electromechanical relay are arranged in a common housing.

13. The assembly according to claim 11, wherein the system for monitoring the electromechanical relay is adapted to be fixed to the electromechanical relay.

14. A method for monitoring relay operation conditions comprising the steps of:
providing a system for monitoring an electromechanical relay to an electromechanical relay, wherein the electromechanical relay includes a coil for actuating at least one switch, the system comprising:
at least one sensor adapted to measure an operating condition of the electromechanical relay,
at least one controller communicatively connected to the at least one sensor and at least one memory, wherein the at least one controller is adapted to store the measured operating condition in the at least one memory,
at least one transmitter, operatively connected to the controller, wherein the transmitter is adapted to transmit a stored measured operating condition to a remote device, and
at least one power source adapted to power at least one element chosen from the at least one sensor, the at least one controller and the at least one transmitter, wherein at least one of the power source and the at least one sensor share at least one detection portion;
measuring at least one operating condition of the electromechanical relay, wherein the sensor is adjacent or attached to the electromechanical relay;
storing the at last one measured operating condition in at least one memory; and
transmitting at least one stored measured operating condition to a the remote device.

* * * * *

UNITED STATES PATENT AND TRADEMARK OFFICE
CERTIFICATE OF CORRECTION

| | | |
|---|---|---|
| PATENT NO. | : 11,004,638 B2 | |
| APPLICATION NO. | : 16/584271 | |
| DATED | : May 11, 2021 | |
| INVENTOR(S) | : John Thomas Compton et al. | |

It is certified that error appears in the above-identified patent and that said Letters Patent is hereby corrected as shown below:

In the Claims

Please replace the second occurrence of "at least one sensor adapted to measure an operating condition of the electromechanical relay, wherein the sensor is arranged adjacent or attached to the electromechanical relay" in Claim 1 with "at least one controller communicatively connected to the at least one sensor and at least one memory, wherein the at least one controller is adapted to store the measured operating condition in the at least one memory".

Please add "at least one" between "the" and "controller" in the fourth clause of Claim 1.

Please add "at least one" between "the" and "controller" in the fourth clause of Claim 11.

Please add "at least one" between "the" and "controller" in the fourth clause of Claim 14.

Signed and Sealed this
Second Day of November, 2021

Drew Hirshfeld
*Performing the Functions and Duties of the*
*Under Secretary of Commerce for Intellectual Property and*
*Director of the United States Patent and Trademark Office*